United States Patent [19] [11] Patent Number: 4,725,450
Kokubo et al. [45] Date of Patent: Feb. 16, 1988

[54] METHOD FOR FABRICATING A SEMICONDUCTOR LASER DEVICE

[75] Inventors: Yoshihiro Kokubo; Wataru Susaki, both of Hyogo, Japan

[73] Assignee: Mitsubishi Denki Kabushiki Kaisha, Tokyo, Japan

[21] Appl. No.: 20,221

[22] Filed: Feb. 27, 1987

[30] Foreign Application Priority Data

Feb. 28, 1986 [JP] Japan .................. 61-44641

[51] Int. Cl.⁴ .......................... H01S 3/18; H01S 3/00; H01L 33/00
[52] U.S. Cl. .................. 437/129; 437/133; 437/90; 437/126; 437/236; 372/44
[58] Field of Search ............ 29/569 L, 576 E, 576 J; 148/DIG. 95; 372/44, 46, 49

[56] References Cited

U.S. PATENT DOCUMENTS

| 3,806,830 | 4/1974 | Yonezu .................. 372/49 |
| 4,317,086 | 2/1982 | Scifres et al. ............ 372/49 |
| 4,425,650 | 1/1984 | Mito et al. .............. 29/569 L |
| 4,447,905 | 5/1984 | Dixon et al. ............. 372/46 |
| 4,536,940 | 8/1985 | Henry et al. ............ 29/569 L |
| 4,545,057 | 10/1985 | Hayakawa et al. ........ 372/46 |
| 4,567,060 | 1/1986 | Hayakawa et al. ........ 29/569 L |
| 4,637,122 | 1/1987 | Camey et al. ........... 29/569 L |

FOREIGN PATENT DOCUMENTS 588092 1/1978 Japan .
609189A 1/1985 Japan .
60-214578 10/1985 Japan .

OTHER PUBLICATIONS

Appl. Phys. Lett. 37(1) Jul. 1980, "Reduction of GaAs Diode Laser Spontaneous Emission" by W. Streifer et al., pp. 10–12.
Appl. Phys. Lett., 40, Jun. 15, 1982, "Large Optical Cavity AlGaAs Buried Heterostructure Window Lasers", by H. Blauvelt et al.

Primary Examiner—Brian E. Hearn
Assistant Examiner—Chi-Tso Huang
Attorney, Agent, or Firm—Lowe, Price, LeBlanc, Becker & Shur

[57] ABSTRACT

A semiconductor laser device is fabricated by forming a first semiconductor layer of N type GaAs to be a current narrowing layer on a P type GaAs semiconductor substrate, forming a second semiconductor layer of P type AlGaAs on the first semiconductor layer, removing said second semiconductor layer by etching except the proximity of the portion to be the end surface of a resonator, forming a striped groove which is deep enough to penetrate the first semiconductor layer and extends to that direction which crosses the surface to be the end surface of the resonator and, depositing a lower clad layer, an active layer, an upper layer and a contact layer in this order.

2 Claims, 7 Drawing Figures

4,725,450

METHOD FOR FABRICATING A SEMICONDUCTOR LASER DEVICE

BACKGROUND OF THE INVENTION

1. Field of the Invention

The present invention relates to a method for fabricating a semiconductor laser device, and more particularly to a method for fabricating a semiconductor laser device for providing high output.

2. Description of the Prior Art

FIGS. 1A to 1C are perspective views showing a method for fabricating a conventional semiconductor laser device in order of the manufacturing steps. The fabricating method of the conventional semiconductor laser device will be described. First, as shown in FIG. 1A, an N type GaAs layer 2 to be a current narrowing layer is deposited on a semiconductor substrate 1 of P type GaAs. Then, as shown in FIG. 1B, the GaAs layer 2 is selectively etched to form a striped groove 3 which is deep enough to reach the semiconductor substrate 1 and extends to that portion to be an end surface of a resonator. Then, a lower clad layer 4 of P type AlGaAs, an active layer 5 of P type AlGaAs, an upper clad layer 6 of N type AlGaAs and a contact layer 7 of N type GaAs are deposited in this order to form a semiconductor laser device shown in FIG. 1C.

The operation of a conventional semiconductor laser device will be described. Due to the presence of the current narrowing layer, the current over the active layer 5 does not flow over the entire surface but flows only along the portions adjacent to that region where the above described current narrowing layer breaks. The optical output rises as the current rises.

In a conventional semiconductor laser device fabricated according to the above described method, the active layer 5 extends uniformly to the end surface of the resonator, so that the energy band gap of the end surface becomes a little narrower than that of the central portion due to the nature of the molecule, resulting in the greater absorption of light than the emission of the light. Therefore, when the current is raised in order to increase the optical output, a breakdown occurs at the end surface because of the heat and the absorption of light.

A structure having no active layer at the end surface for preventing such breakdown is disclosed in, for example, H. Blauvelt, et al. "Large optical cavity AlGaAs buried heterostructure window lasers", Appl. Phys. Lett. 40(12), pp. 1029–1031, 15 June 1982, in which that portion to be the window at the end surface is made in such a manner that a cavity is formed at that portion by etching and then it is filled with AlGaAs of a new composition. This semiconductor laser device, however, still presents a problem that, although it lowers the density of light to preclude the deterioration, it is still subjected to deterioration due to the still occurring absorption of the light.

SUMMARY OF THE INVENTION

It is a main object of the present invention to provide a method for readily fabricating a semiconductor laser device which is capable of preventing a breakdown by eliminating the absorption of light at the end surface of the resonator.

Briefly described, the present invention is a method for fabricating a semiconductor laser device in which an oxide layer is formed only at the proximity of the portion to be an end surface of a resonator of a first semiconductor layer to be a current narrowing layer, and then a lower clad layer and an active layer are formed.

According to the present invention, an oxide layer is formed on the first semiconductor layer at the proximity of the end surface of the resonator, and the lower clad layer and the active layer do not readily grow on the oxide layer. Therefore, the light generated at the active layer is not absorbed at the end surface, and thus the heating or the breakdown can be prevented.

These objects and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 2A to 2D are perspective views showing, in the order of the manufacturing steps, a method for fabricating a semiconductor laser device according to one embodiment of the present invention. The method for fabricating a semiconductor laser device will be hereinafter described with reference to FIGS. 2A to 2D.

Figure 1A:
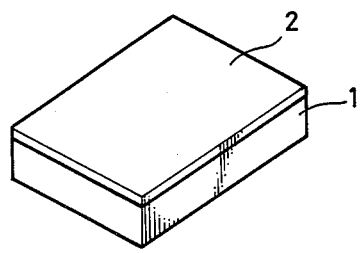
FIGS. 1A to 1C are perspective views showing the fabricating method of a conventional semiconductor laser device in the order of the manufacturing steps.
Figure 1B:
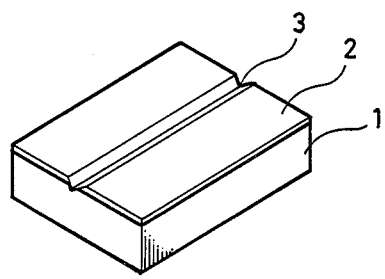
Figure 1C:
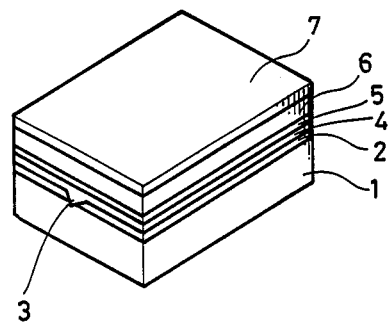
Figure 2A:
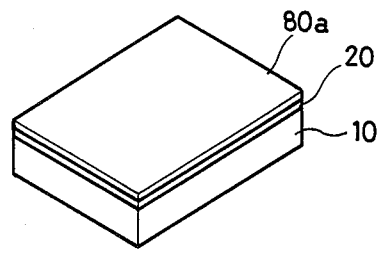
FIGS. 2A to 2D are perspective views showing the fabricating method of a semiconductor laser device according to the present invention in the order of the manufacturing steps.
Figure 2B:
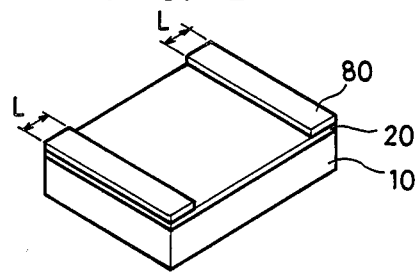
Figure 2C:
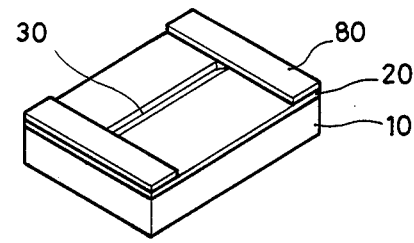
Figure 2D:
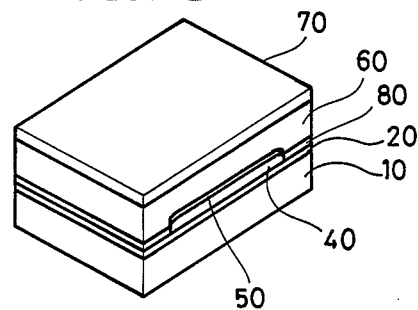

First, as shown in FIG. 2A a first semiconductor layer 20 of N type GaAs to be a current narrowing layer is formed on a main surface of a P type GaAs semiconductor substrate 10, and then a second semiconductor layer 80a of P type AlGaAs is formed on the first semiconductor layer 20 by crystal growth. Next, as shown in FIG. 2B, the second semiconductor layer 80a is removed by etching except the proximity of that portion to be the end surface of the resonator. On this occasion, at least the surface of the second semiconductor layer 80a is oxidized to form an oxide film 80, since the etching step is performed with the semiconductor wafer brought out of the furnace for the crystal growth. The width L of the oxide film 80 is about 5 μm. Then, as shown in FIG. 2C, a striped groove 30 is formed which is deep enough to penetrate the first semiconductor layer 20 and extends to that direction which crosses the surface to be the end surface of the resonator. Then, as shown in FIG. 2D, a lower clad layer 40 of P type GaAs having the thickness of about 0.5 μm is formed on the main surface of the first semiconductor layer 20 where there is no oxide film 80 provided. An active layer 50 of P type AlGaAs which is thicker than 0.1 μm is formed on the main surface of the lower clad layer 40, and then an upper clad layer 60 of N type AlGaAs thicker than 5 μm is formed on the main surfaces of the active layer 50 and the oxide film 80. Then, a contact layer 70 of N type GaAs is deposited on the main surface of the upper clad layer 60. On this occasion, crystals do not grow on the oxide film 80, but those crystals grown on the first semiconductor layer 20 extend in the lateral direction according to the film thickness. Since the width of the oxide film from the end surface of the resonator is 5 μm and the thicknesses of the lower clad layer, the active layer and the upper clad layer are more than 0.5 μm, 0.1 μm and 5 μm, respectively, the lateral extension of the lower clad layer 40 and the active layer 50 do not reach the end surface of the resonator while the lateral extension of the upper clad layer 60 reaches the end surface of the resonator.

In a semiconductor laser device formed according to the above described manufacturing method, the current over the active layer 50 flows only along the proximity of the portion where the current narrowing layer breaks. The optical output increases as the current rises. If the active layer 50 extends to the end surface, then the energy band gap of the end surface becomes a little narrower than that of the central portion due to the nature of the molecule, resulting in the absorption of light which is greater than the emission of light. Therefore, when the current is raised to increase the optical output, a breakdown occurs at the end surface due to the heating and the absorption of light. However, in the semiconductor laser device according to the present invention, the active layer 50 does not extend to the end surface and the latter is formed of the materials having wider band gap than the active layer 50, so that even if the energy band gap becomes a little narrower at the end surface, the light generated at the active layer 50 is not absorbed at the end surface. Therefore, heating or breakdown can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a semiconductor laser device, comprising the steps of:
    depositing a first semiconductor layer of a second conductivity type on a semiconductor substrate of a first conductivity type;
    forming by oxidation an oxide film of a predetermined width on the proximity of at least one end of that region of said first semiconductor layer which is to be an end surface of a resonator;
    forming a groove which is deep enough to penetrate said first semiconductor layer and extends to that direction which crosses said surface to be the end surface of a resonator on the central portion of said first semiconductor region;
    forming a lower clad layer of the first conductivity type having a thickness smaller than the width of said oxide film on that portion of said first semiconductor layer where said oxide film is not provided;
    forming an active layer of the second conductivity type on said lower clad layer; and
    forming an upper clad layer of the second conductivity having a thickness larger than the width of said oxide film on said active layer and said oxide film.

2. A method for fabricating a semiconductor laser device according to claim 1, wherein
    said semiconductor substrate and said first semiconductor layer are formed of GaAs;
    said lower clad layer, said active layer and said upper clad layer are formed of AlGaAs; and
    said oxide film is formed by the oxidation of AlGaAs.

* * * * *